(12) United States Patent
Kim

(10) Patent No.: US 8,728,909 B2
(45) Date of Patent: May 20, 2014

(54) METHOD FOR FORMING THE SEMICONDUCTOR CELL

(75) Inventor: Kyung Do Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 294 days.

(21) Appl. No.: 13/210,654

(22) Filed: Aug. 16, 2011

(65) Prior Publication Data

US 2012/0289024 A1   Nov. 15, 2012

(30) Foreign Application Priority Data

May 12, 2011   (KR) .................. 10-2011-0044738

(51) Int. Cl.
*H01L 21/76*   (2006.01)
(52) U.S. Cl.
USPC .................. 438/433; 257/E21.551

(58) Field of Classification Search
USPC .................. 438/433; 257/E21.551
See application file for complete search history.

(56) References Cited

U.S. PATENT DOCUMENTS

| | | | |
|---|---|---|---|
| 2004/0159886 A1* | 8/2004 | Lee et al. .................. | 257/331 |
| 2005/0090059 A1* | 4/2005 | Lee et al. .................. | 438/257 |
| 2008/0318383 A1* | 12/2008 | Ujihara .................. | 438/270 |
| 2010/0055856 A1* | 3/2010 | Hong et al. .................. | 438/239 |
| 2012/0289024 A1* | 11/2012 | Kim .................. | 438/433 |

* cited by examiner

Primary Examiner — Jarrett Stark

(57) ABSTRACT

A semiconductor cell includes first trenches defining fin type active regions within the semiconductor substrate and adjacent to each other, second trenches disposed at one side and the other side of the first trenches, adjacent to the first trench and including fin type active regions, a first oxide layer formed on each of surfaces of the first trenches, and a second oxide layer formed on each of surfaces of the second trenches and having a thicker thickness than the first oxide layer. Although the critical dimension of the fin is increased, the gate drivability can be improved.

13 Claims, 10 Drawing Sheets

CELL ARRAY

METHOD FOR FORMING THE SEMICONDUCTOR CELL

CROSS-REFERENCES TO RELATED APPLICATION

The present application claims priority to Korean patent application number 10-2011-0044738 filed on 12 May 2011, which is incorporated by reference in its entirety.

BACKGROUND OF THE INVENTION

1. Technical Field

The present invention relates to a semiconductor cell including a fin-type buried gate and a method of manufacturing the same.

2. Related Art

Most electric appliances include semiconductor devices. Semiconductor devices include electric elements such as transistors, resistors, capacitors and the like. The electric elements are designed to perform partial functions of the electric appliances and are integrated on a semiconductor substrate. For example, electronic appliances such as computers or digital cameras include memory chips for storing information and processing chips for controlling the information. The memory chips and processing chips include electric elements integrated on the semiconductor substrate.

On the other hand, semiconductor devices need to be more highly integrated to satisfy user demands for good performance and low price. As the integration degree of semiconductor devices increases, the design rule is scaled down and patterns of the semiconductor devices become fine. With extra miniaturization and high integration, although a total chip area increases in proportion to the increase of memory capacity, a cell area where patterns of semiconductor devices are formed is substantially reduced. Since as many patterns as possible have to be formed in the limited cell area to ensure the desired memory capacity, fine patterns having a reduced critical dimension must be formed.

Thereby, a method of reducing a unit cell size has been studied. Currently, a study on a method of reducing a chip size of a dynamic random access memory (DRAM) device and increasing the number of chips per a wafer by employing a 6F2 or a 4F2 configuration instead of an 8F2 configuration has progressed.

In a 6F2 unit cell, active regions having an island type are arranged to be diagonally spaced apart, but implementation is limited due to the high integration of semiconductor devices. Thereby, a method of forming active regions having a line type, rather than an island type, has been suggested. In this configuration, active regions are patterned in a line extending in a diagonal direction and a device isolation layer is also patterned in a line type to be disposed between the active regions.

However, as a semiconductor device becomes more highly integrated, the critical dimension (CD), a minimum pattern size available under a given process condition, of a gate is becomes narrower and a channel length is reduced. This results in a short channel effect (SCE), which degrades performance of a field effect transistor (FET). So as to overcome this problem, a multi-channel FET, such as a recessed gate or a fin type gate, is used. The recessed gate is formed by forming a trench in a semiconductor substrate to a predetermined depth and filling the trench with a conductive material.

On the other hand, the fin type gate is formed in an uplifted substrate in a fin shape to increase a contact area between the active region and a gate, thereby improving gate's performance in drivability and electric characteristics.

When the above-described fin type gate is employed for a device that has a line type active region and a line type device isolation layer, a sub-threshold swing of the semiconductor device can be improved. However, as CD decreases, it becomes hard to control the gate surrounding the fin shaped substrate and thus the sub-threshold swing property is degraded.

SUMMARY

The present invention is directed to providing a semiconductor cell capable of preventing characteristics of a semiconductor device from degrading when a critical dimension (CD) of a fin, which is formed within a semiconductor substrate including a line type active region and a line type device isolation layer, is increased and a method of forming the same.

According to one aspect of an exemplary embodiment, a semiconductor cell includes a line type device isolation layer formed in a semiconductor substrate, the device isolation layer extending in a first direction; a line type active region defined by the device isolation layer; a first trench defining a fin type active region in the semiconductor substrate; a second trench disposed adjacent to the first trench; a first oxide layer formed over the first trench; and a second oxide layer formed over the second trench and having a larger thickness than the first oxide layer.

The semiconductor cell may further include a gate conductive layer formed over the first oxide layer and the second oxide layer; and an insulating layer formed over the gate conductive layer.

The semiconductor cell may further include an active gate defined by the gate conductive layer formed in the first trench; and an isolation gate defined by the gate conductive layer formed in the second trench.

According to one aspect of an exemplary embodiment, a method of forming a semiconductor cell includes forming a line type device isolation layer in a semiconductor substrate; forming a first trench defining a fin type active region in the semiconductor substrate; forming a second trench in the semiconductor substrate to be in parallel to the first trench, the second trench defining an isolation region along with the line type device isolation layer; performing an ion implantation process on the first trench; and forming a first oxide layer over the first trench and a second oxide layer over the second trench, wherein the second oxide layer is thicker than the first oxide layer.

The forming the first trench and the second trench may include performing an anisotropic etching process for the semiconductor substrate and the device isolation layer.

The performing the anisotropic etching process may include etching the semiconductor substrate to a first depth and etching the device isolation layer to a second depth deeper than the first depth.

The fin type active region may protrude from the device isolation layer etched to the second depth by a difference between the first depth and the second depth.

The performing the ion implantation process may include forming a mask pattern on the second trench and performing the ion implantation process for the surface of the first trench using the mask pattern as a mask.

The performing the ion implantation process may include ion-implanting nitrogen ions.

The ion implantation process may be performed with a dose of $1\times10^{12}/cm^2$ to $1\times10^{15}/cm^2$ and energy of 5 KeV to 100 KeV.

The ion implantation process is performed in a direction of the first trench at an angle of 1 to 45 degrees with respect to a direction perpendicular to the semiconductor substrate.

The method may further include, after the performing the ion implantation process, removing the mask pattern.

The method may further include, after the forming the first oxide layer and the second oxide layer, forming a gate conductive layer on each of the first oxide layer and the second oxide layer and forming an insulating layer over the semiconductor substrate and the gate conductive layer.

According to another aspect of another exemplary embodiment, a method of forming a semiconductor cell includes forming a pair of device isolation line patterns in a semiconductor substrate; forming a pair of first trenches extending across the pair of the device isolation line patterns to a first depth; forming a second trench between the pair of the first trenches to be extend across the pair of the device isolation line patterns, performing ion implantation selectively on the second trench so that an amount of the ions implanted in the second trench is different from that implanted in the first trench; forming an isolation gate oxide pattern over any of the pair of the first trenches and an active gate oxide pattern over the second trench, wherein the isolation gate oxide pattern is formed thicker than the active gate oxide pattern.

The first trench and second trench are formed to a second depth deeper than the first depth in the device isolation line patterns so that the active region is in an uplifted fin shape.

The isolation gate oxide pattern and the active gate oxide pattern are formed by oxidizing the substrate exposed in the first trenches and the second trench.

The method further comprising forming an isolation gate pattern over the isolation gate oxide pattern and an active gate pattern over the active gate oxide pattern.

According to another aspect of an exemplary embodiment, a cell array includes a transistor including a semiconductor cell; and a storage unit coupled to the transistor, wherein the semiconductor cell includes: first trenches including fin type active regions within the semiconductor substrate and adjacent to each other; second trenches disposed at one side and the other side of the first trenches, adjacent to the first trench and including fin type active regions; a first oxide layer formed on each of surfaces of the first trenches; and a second oxide layer formed on each of surfaces of the second trenches and having a thicker thickness than the first oxide layer.

According to another aspect of an exemplary embodiment, a semiconductor device includes a cell array; a row decoder coupled to the cell array; a column decoder coupled to the cell array; and a sense amplifier coupled to the column decoder, wherein a cell array includes a transistor including a semiconductor cell; and a storage unit, wherein the semiconductor cell includes: first trenches including fin type active regions within the semiconductor substrate and adjacent to each other; second trenches disposed at one side and the other side of the first trenches, adjacent to the first trench and including fin type active regions; a first oxide layer formed on each of surfaces of the first trenches; and a second oxide layer formed on each of surfaces of the second trenches and having a thicker thickness than the first oxide layer.

According to another aspect of an exemplary embodiment, a semiconductor module includes a semiconductor device; a command link configured to transmit a control signal from and to the semiconductor device; and a data link configured to transmit data from and to the semiconductor device wherein the semiconductor device includes a cell array; a row decoder; a column decoder; and a sense amplifier, wherein the cell array includes a transistor including a semiconductor cell; and a storage unit, wherein the semiconductor cell includes: first trenches including fin type active regions within the semiconductor substrate and adjacent to each other; second trenches disposed at one side and the other side of the first trenches, adjacent to the first trench and including fin type active regions; a first oxide layer formed on each of surfaces of the first trenches; and a second oxide layer formed on each of surfaces of the second trenches and having a thicker thickness than the first oxide layer.

According to another aspect of an exemplary embodiment, a semiconductor system includes a semiconductor module; and a controller configured to control the semiconductor module wherein the semiconductor module includes a semiconductor device; a command link; and a data link, wherein the semiconductor device includes a cell array; a row decoder; a column decoder; and a sense amplifier, wherein the cell array includes a transistor including a semiconductor cell; and a storage unit, wherein the semiconductor cell includes: first trenches including fin type active regions within the semiconductor substrate and adjacent to each other; second trenches disposed at one side and the other side of the first trenches, adjacent to the first trench and including fin type active regions; a first oxide layer formed on each of surfaces of the first trenches; and a second oxide layer formed on each of surfaces of the second trenches and having a thicker thickness than the first oxide layer.

According to another aspect of an exemplary embodiment, an electronic unit includes a semiconductor system; and a processor configured to control the semiconductor system wherein the semiconductor system includes a semiconductor module; and a controller, wherein the semiconductor module includes a semiconductor device; a command link; and a data link, wherein the semiconductor device includes a cell array; a row decoder; a column decoder; and a sense amplifier, wherein the cell array includes a transistor including a semiconductor cell; and a storage unit, wherein the semiconductor cell includes: first trenches including fin type active regions within the semiconductor substrate and adjacent to each other; second trenches disposed at one side and the other side of the first trenches, adjacent to the first trench and including fin type active regions; a first oxide layer formed on each of surfaces of the first trenches; and a second oxide layer formed on each of surfaces of the second trenches and having a thicker thickness than the first oxide layer.

The processor may include a central processing unit (CPU) or a graphic processing unit (GPU). The CPU may include a computer or a mobile. The GPU may include a graphic.

According to another aspect of an exemplary embodiment, an electronic system includes an electronic unit; and an interface configured to transmit a communication signal from and to the electronic unit, wherein the electronic unit includes a semiconductor system; and a processor, wherein the semiconductor system includes a semiconductor module; and a controller, wherein the semiconductor module includes a semiconductor device; a command link; and a data link, wherein the semiconductor device includes a cell array; a row decoder; a column decoder; and a sense amplifier, wherein the cell array includes a transistor including a semiconductor cell; and a storage unit, wherein the semiconductor cell includes: first trenches including fin type active regions within the semiconductor substrate and adjacent to each other; second trenches disposed at one side and the other side of the first trenches, adjacent to the first trench and including fin type active regions; a first oxide layer formed on each of surfaces of the first trenches; and a second oxide layer formed on each of surfaces of the second trenches and having a thicker thickness than the first oxide layer.

The interface may include any of a monitor, a key board, a pointing device (mouse), universal serial bus (USB), a display, and a speaker.

These and other features, aspects, and embodiments are described below in the section entitled "DESCRIPTION OF EXEMPLARY EMBODIMENT."

BRIEF DESCRIPTION OF THE DRAWINGS

The above and other aspects, features, and other advantages of the subject matter of the present disclosure will be more clearly understood from the following detailed description taken in conjunction with the accompanying drawings, in which.

DESCRIPTION OF EXEMPLARY EMBODIMENT

Figure 1:
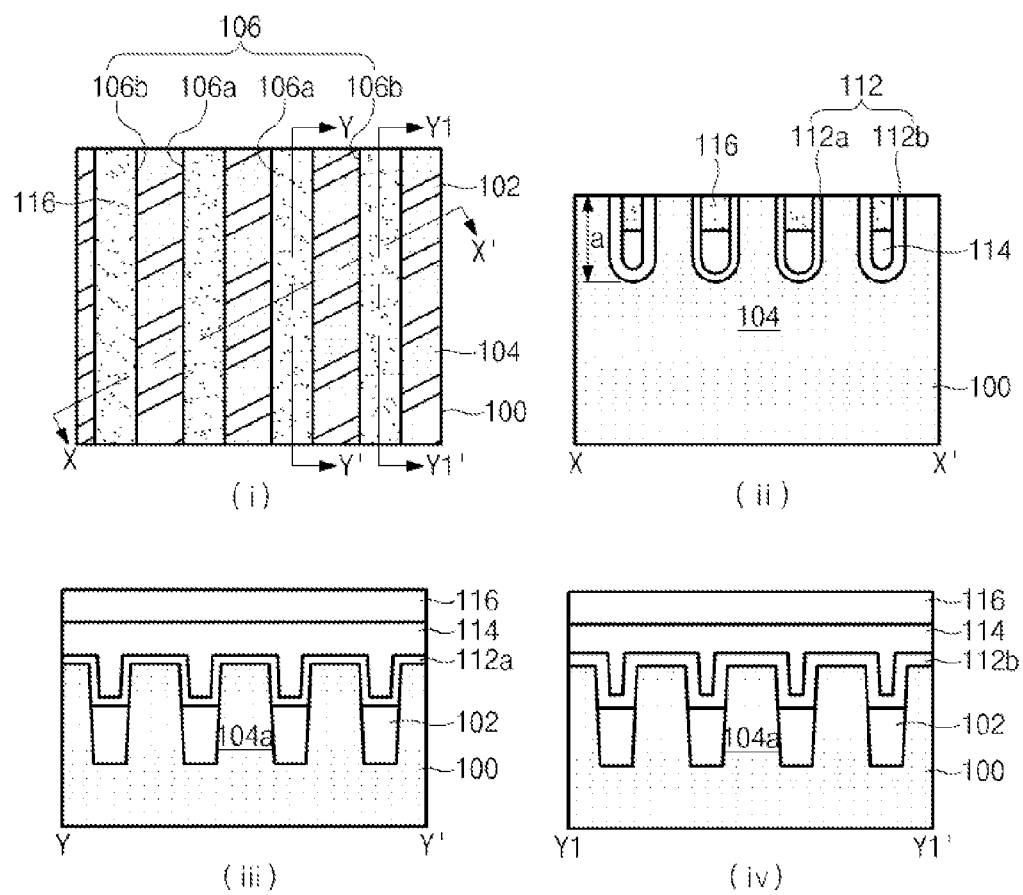
FIG. 1 is a view illustrating a semiconductor cell according to an exemplary embodiment of the present invention, wherein (i) is a plan view, (ii) is a cross-sectional view taken along a line X-X' of (i), (iii) is a cross-sectional view taken along a line Y-Y' of (i), and (iv) is a cross-sectional view taken along a line Y1-Y1' of (i)

Exemplary embodiments are described herein with reference to cross-sectional illustrations that are schematic illustrations of exemplary embodiments (and intermediate structures). As such, variations in the shapes in the illustrations as a result, for example, of manufacturing techniques and/or tolerances, are to be expected. Thus, exemplary embodiments should not be construed as limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may also be present.

Hereinafter, exemplary embodiments of the present invention will be described in detail with reference to the accompanying drawings.

FIG. 1 is a view illustrating a semiconductor cell according to an exemplary embodiment of the present invention, wherein (i) is a plan view, (ii) is a cross-sectional view taken along a line X-X' of (i), (iii) is a cross-sectional view taken along a line Y-Y' of (i), and (iv) is a cross-sectional view taken along a line Y1-Y1' of (i).

Referring to FIG. 1, the semiconductor cell according to an exemplary embodiment includes first trenches 106a defining fin type active regions 104a in a semiconductor substrate 100, second trenches 106b next to the first trenches 106a, a first oxide layer 112a formed over a surface of each of the first trenches 106a, and a second oxide layer 112b formed over a surface of each of the second trenches 106b. The second oxide layer 112b is formed thicker than the first oxide layer 112a.

The semiconductor cell may further include a line type device isolation layer 102 extending in a diagonal direction with respect to the first trenches 106a, an active region defined by the device isolation layer 102, a gate conductive layer 114 formed over each of the first gate oxide layer 112a and the second oxide layer 112b, and an insulating layer 116 formed over each of the first trenches 106a and the second trenches 106b. Hereinafter, the gate conductive layer 114, which is formed over the first oxide layer 112a and fills in a portion of the first trench 106a, will be also referred to as an active gate. The gate conductive layer 114, which is formed over the second oxide layer 112b and fills in a portion of the second trench 106b, will be also referred to as an isolation gate.

Since the second oxide layer 112b, formed over the surface of the second trench 106b, is formed to be thicker than the first oxide layer 112a, formed over the surface of the first trench 106a, the sub-threshold swing is improved. In addition, since the first oxide layer 112a and the second oxide 112b are formed so that the second oxide layer 112b is thicker than the first oxide layer 112a, the isolation gate is designed to have a higher threshold voltage so that the isolation gate remains inactivated at a given threshold voltage at which the active gate is activated.

Figure 2A:
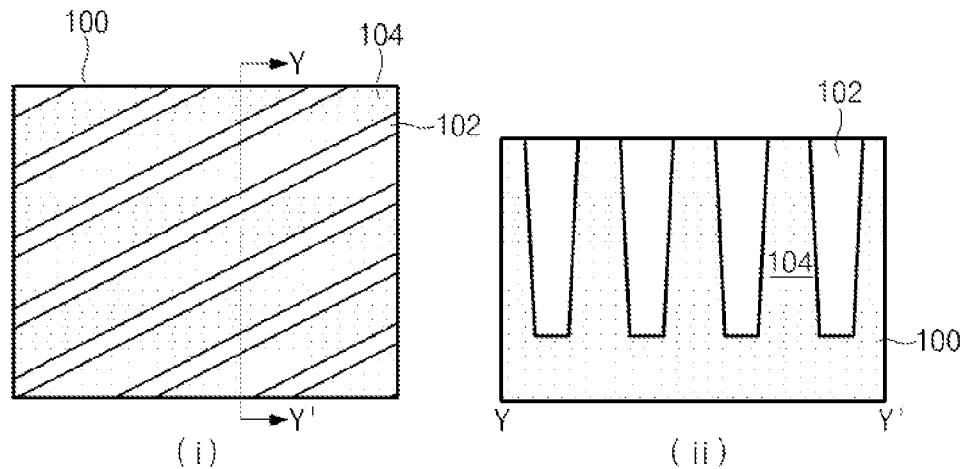
FIG. 2A is a view illustrating a method of forming a semiconductor cell according to an exemplary embodiment of the present invention, wherein (i) is a plan view and (ii) is a cross-sectional view taken along a line Y-Y' of (i)

Hereinafter, a method of manufacturing a semiconductor cell having the above-described structure according to an exemplary embodiment of the present invention will be described. FIG. 2A is a view illustrating a method of forming a semiconductor cell according to an exemplary embodiment of the present invention, wherein (i) is a plan view and (ii) is a cross-sectional view taken along the line Y-Y' of (i).

Referring to FIG. 2A, a device isolation layer 102 is formed in a semiconductor substrate 100. In an embodiment, the device isolation layer 102 may be formed in a line pattern extending in a diagonal direction. An active region 104 defined by the device isolation layer 102 may also having a line pattern extending in the diagonal direction.

As an example, a method of forming the device isolation layer 102 will be described below. A pad insulating layer pattern is formed on the semiconductor substrate 100. In an embodiment, the pad insulating layer pattern may be formed by oxidizing a surface of the semiconductor substrate 100 to form a silicon oxide layer, depositing a silicon nitride layer on the silicon oxide layer, and patterning the silicon oxide layer and a silicon nitride layer by a photo etching process to separate the active region and a device isolation region. A mask for patterning the active region and the device isolation region may have a line and space pattern.

Subsequently, portions of the semiconductor substrate 100 exposed by the pad insulating layer pattern are etched to a predetermined depth to form trenches. The semiconductor substrate 100 exposed by the trenches is subject to an oxidation process, thereby forming protective oxide layers. A lining insulating layer may further be formed over an entire surface of the semiconductor substrate in which the protective oxide layer is formed.

An insulating layer is coated on the entire surface of the semiconductor substrate 100 by a spin on dielectric (SOD) method. The insulating layer may include silicon dioxide, silicate glass or silicate glass doped with boron or phosphorous. The SOD insulating layer coated by a SOD method is formed over the trench. Since a surface of the SOD insulating layer is not uniform due to the uneven underlying structure formed after the SOD insulating layer is buried, a chemical mechanical polishing process is performed to planarize the entire surface of the semiconductor substrate 100 over which the SOD insulating layer is formed. A method of filling in the trench is not limited to coating the insulating layer. For example, a method of coating a high density plasma (HDP) insulating layer may be used, instead.

Figure 2B:
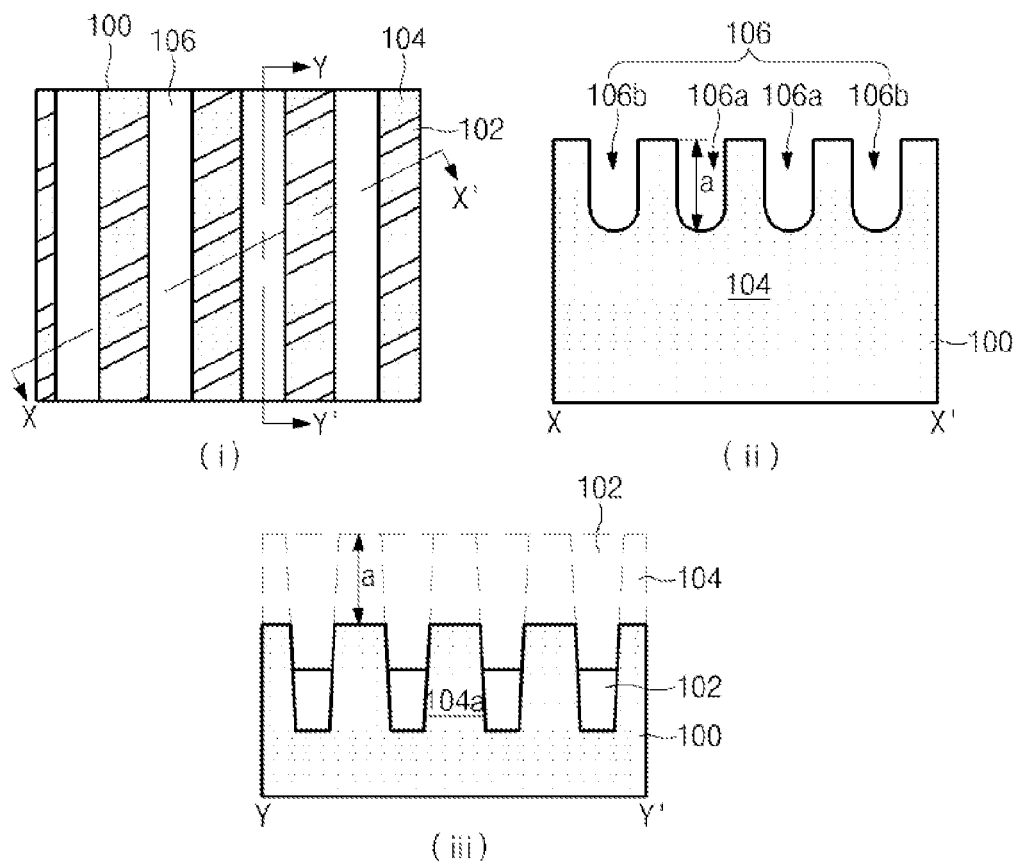
FIG. 2B is a view illustrating a method of forming a semiconductor cell according to an exemplary embodiment of the present invention, wherein (i) is a plan view, (ii) is a cross-sectional view taken along a line X-X' of (i), and (iii) is a cross-sectional view taken along a line Y-Y' of (i)

FIG. 2B is a view illustrating a method of forming a semiconductor cell according to an exemplary embodiment of the present invention, wherein (i) is a plan view, (ii) is a cross-sectional view taken along the line X-X' of (i), and (iii) is a cross-sectional view taken along the line Y-Y' of (i).

Referring to FIG. 2B, the device isolation layer 102 and the active region 104 are etched to a predetermined depth to form trenches 106. The trenches may be formed by performing an anisotropic etching process. The trenches 106 include a first trench 106a defining an active gate and a second trench 106b defining an isolation gate. The trenches 106 may be formed by etching the active region 104 to a first depth "a" as shown in FIG. 2B(ii).

When the trenches 106 are formed by etching the device isolation layer 102 and the active region 104 as shown in FIG. 2B(iii), the device isolation layer 102 is etched deeper than the first depth "a" in the active region 104, so that the trench 106b has a second depth deeper than the first depth "a". A surface of the active region 104 has a step difference from the device isolation layer 102, thereby forming uplifted fin type active regions 104a. For better understanding, the etched portions of the device isolation layer 102 and the active region 104 are illustrated with a dotted line. Before the trenches 106 are formed, an ion implantation process for the active region 104 may be performed to form a junction region and the junction region may include a source/drain.

Figure 2C:
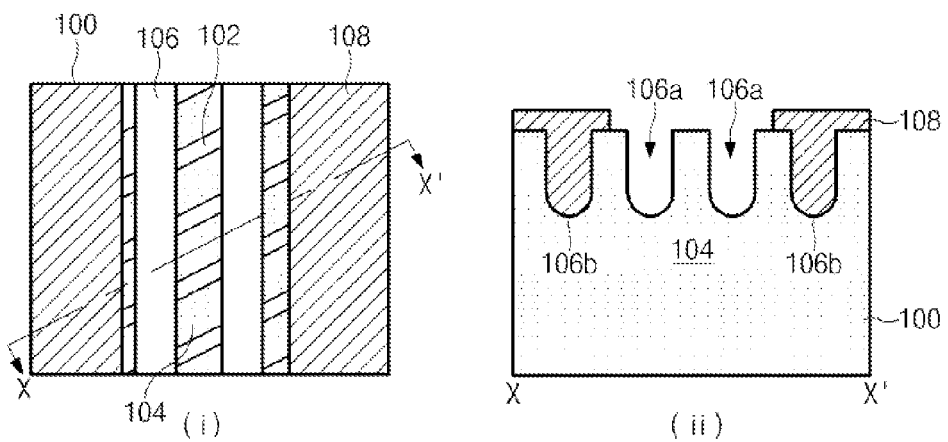
FIG. 2C is a view illustrating a method of forming a semiconductor cell according to an exemplary embodiment of the present invention, wherein (i) is a plan view and (ii) is a cross-sectional view taken along a line X-X' of (i)

FIG. 2C is a view illustrating a method of forming a semiconductor cell according to an exemplary embodiment of the present invention, wherein (i) is a plan view and (ii) is a cross-sectional view taken along a line X-X' of (i). Referring to FIG. 2C, a mask pattern 108 fills the second trenches 106b, but not the first trenches 106a.

Figure 2D:
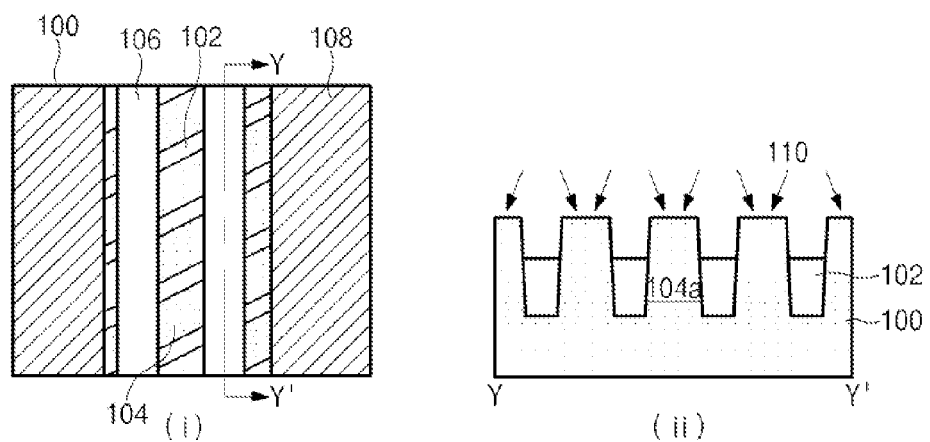
FIG. 2D is a view illustrating a method of forming a semiconductor cell according to an exemplary embodiment of the present invention, wherein (i) is a plan view, (ii) is a cross-sectional view taken along a line Y-Y' of (i)

FIG. 2D is a view illustrating a method of forming a semiconductor cell according to an exemplary embodiment of the present invention, wherein (i) is a plan view, and (ii) is a cross-sectional view taken along the line Y-Y' of (i). Referring to FIG. 2D, an ion implantation process 110 is performed on the semiconductor substrate 100 including the fin type active region 104a. In an embodiment, the ion implantation process 110 may include ion-implanting nitrogen ions. The ion implantation process may be performed in a direction in which the first trench 106a. The ion implantation process conditions can be set as follows: a dose is $1 \times 10^{12}/cm^2$ to $1 \times 10^{15}/cm^2$, energy is 5 KeV to 100 KeV, and an angle is 1 to 45 degrees with respect to a direction perpendicular to the semiconductor substrate 100. In the following process, an oxide layer is formed thinner over the region subject to the ion implantation process 110 than over the region not subject to the ion implantation process 110. Detailed description for the process will be described in more detail with reference to FIG. 2E.

Figure 2E:
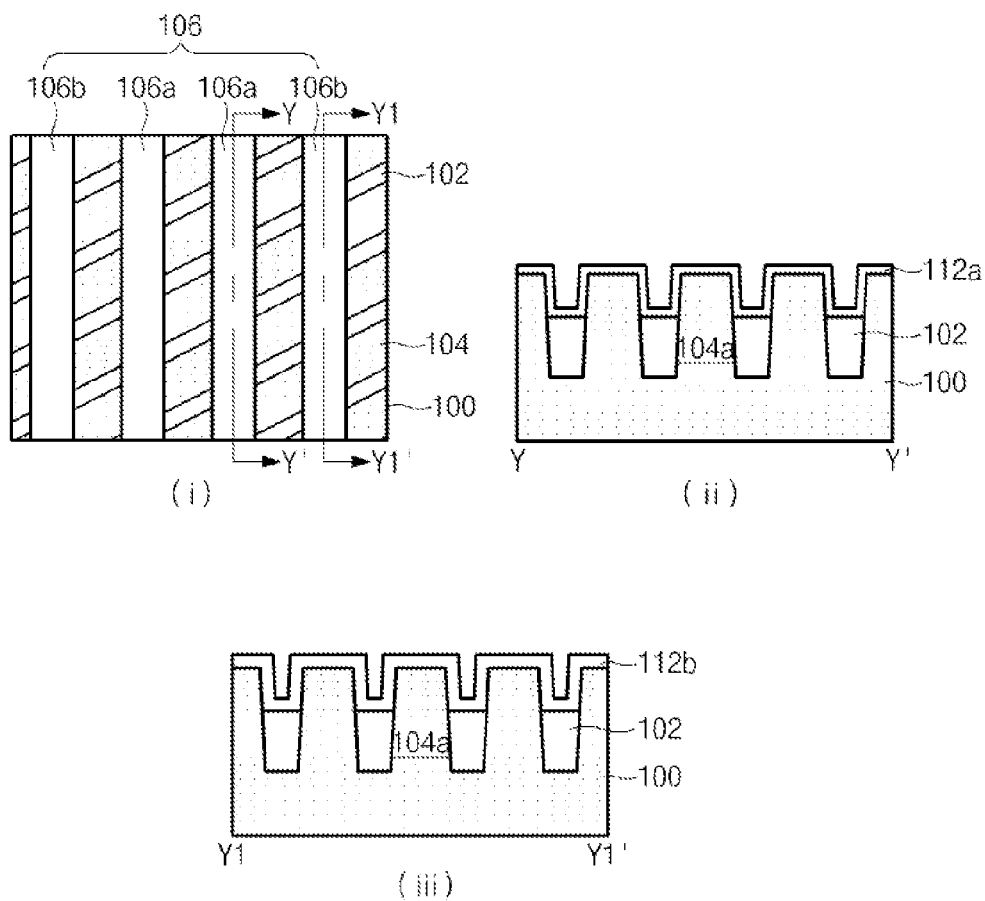
FIG. 2E is a view illustrating a method of forming a semiconductor cell according to an exemplary embodiment of the present invention, wherein (i) is a plan view, (ii) is a cross-sectional view taken along a line Y-Y' of (i), and (iii) is a cross-sectional view taken along a line Y1-Y1' of (i)

FIG. 2E is a view illustrating a method of forming a semiconductor cell according to an exemplary embodiment of the present invention, wherein (i) is a plan view, (ii) is a cross-sectional view taken along a line Y-Y' of (i), and (iii) is a cross-sectional view taken along a line Y1-Y1' of (i). Referring to FIG. 2E, a mask pattern (108 in FIG. 2D) formed on the second trenches 106b is removed and an oxidization process is performed on the surfaces of the first trench 106a and second trench 106b to form a first oxide layer 112a and a second oxide layer 112b, respectively. In an embodiment, the first oxide layer 112a is formed thinner than the second oxide layer 112b. As a result of the ion implantation process 110, an oxidation rate is reduced in the first trench 106a.

As described above, since the ion implantation process (110 of FIG. 2D) is performed for only the surface of the first trench 106a including the fin type active region 104a, the first oxide layer 112a is formed thinner than the second oxide layer 112b formed on the surface of the second trench 106b, thereby improving the sub-threshold swing property in an active gate which will be formed in the first trench 106a. Further, since the second oxide layer 112b formed on the second trench 106b is thicker than the first oxide layer 112a on the surface of the first trench 106a, the isolation gate, which will be formed in the second trench 106b, may have a relatively large threshold voltage. Because the threshold voltage is larger, the isolation gate may remain in an "OFF" state.

Figure 2F:
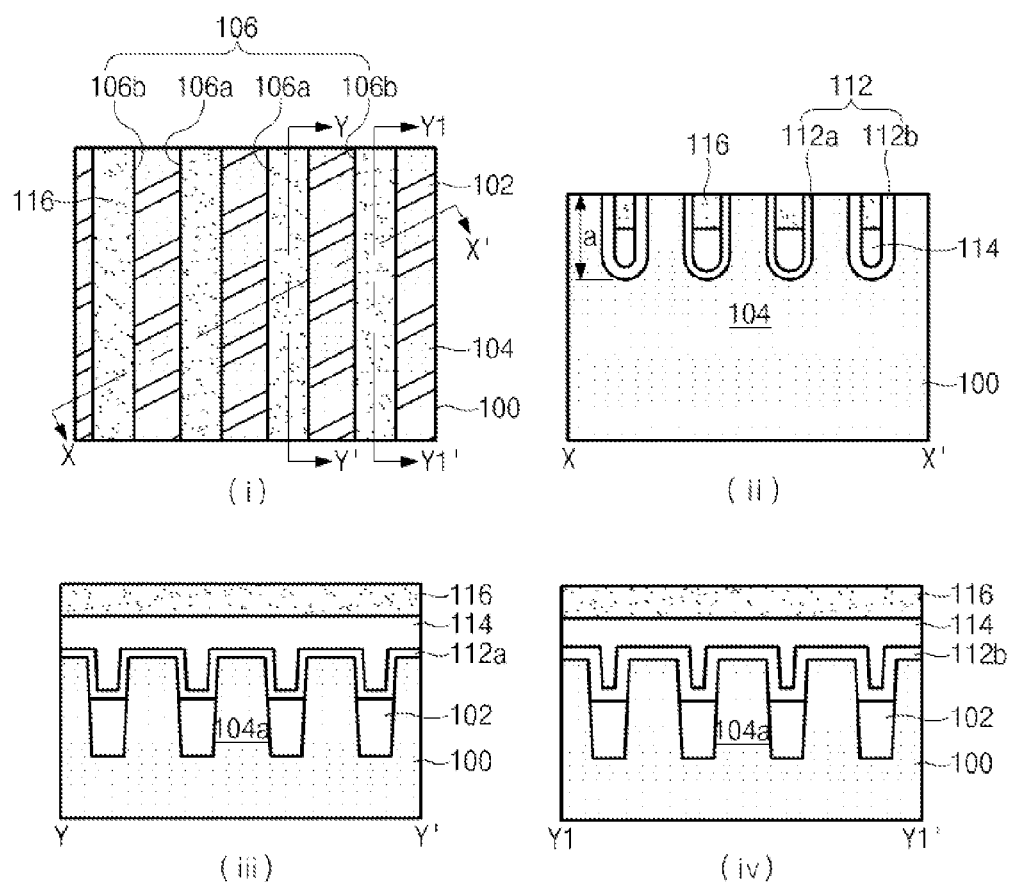
FIG. 2F is a view illustrating a semiconductor cell according to an exemplary embodiment of the present invention, wherein (i) is a plan view, (ii) is a cross-sectional view taken along a line X-X' of (i), (iii) is a cross-sectional view taken along a line Y-Y' of (i), and (iv) is a cross-sectional view taken along a line Y1-Y1' of (i)

FIG. 2F is a view illustrating a semiconductor cell according to an exemplary embodiment of the present invention, wherein (i) is a plan view, (ii) is a cross-sectional view taken along a line X-X' of (i), (iii) is a cross-sectional view taken along a line Y-Y' of (i), and (iv) is a cross-sectional view taken along a line Y1-Y1' of (i). Referring to FIG. 2F, a gate conductive layer 114 is formed over the first trench 106a and the second trench 106b and then an etching back process for the gate oxide layer 114 is performed. Subsequently, an insulating layer 116 is formed over the gate conductive layer 114 and an etching process for planarization of the insulating layer 116 is performed, thereby exposing a surface of the semiconductor substrate 100. The insulating layer 116 is formed to prevent the gate conductive layer 114 from oxidizing.

According to an exemplary embodiment as described above, the fin type active region is formed and then the ion implantation process is performed in the active gate region so that the thickness of the gate oxide layer of the active gate is thinner than the gate oxide layer of the isolation gate. Thus a sub-threshold swing property can be improved. In addition, since the gate oxide layer of the isolation gate is formed thicker than the gate oxide layer of the active gate, the isolation gate can have a relatively higher threshold voltage and thus the isolation gate can remain inactive.

Figure 3:
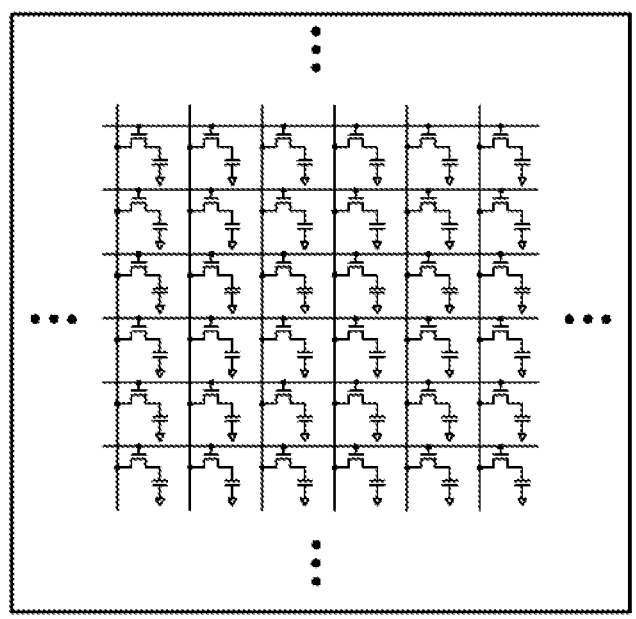
FIG. 3 is a view illustrating a cell array according to an exemplary embodiment of the present invention.

FIG. 3 is a view illustrating a memory cell array according to an exemplary embodiment of the present invention. Referring to FIG. 3, the memory cell array according to an exemplary embodiment includes a transistor including a semiconductor cell (see FIG. 1) and a storage unit. Although not shown in FIG. 3, the transistor may be arranged at an intersection of a bit line and a word line. The bit line and word line allow the data to be stored or to be output based on voltages applied to the column decoder and the row decoder connected to the memory cell array. For example, the bit line may be formed to extend in a first direction and the word line may be formed to extend in a second direction perpendicular to the first direction. A first terminal (for example, a drain terminal) of the transistor may be connected to the bit line, a second terminal (for example, a source terminal) may be connected to a storage unit, and a third terminal (for example, a gate terminal) may be a word line.

Figure 4:
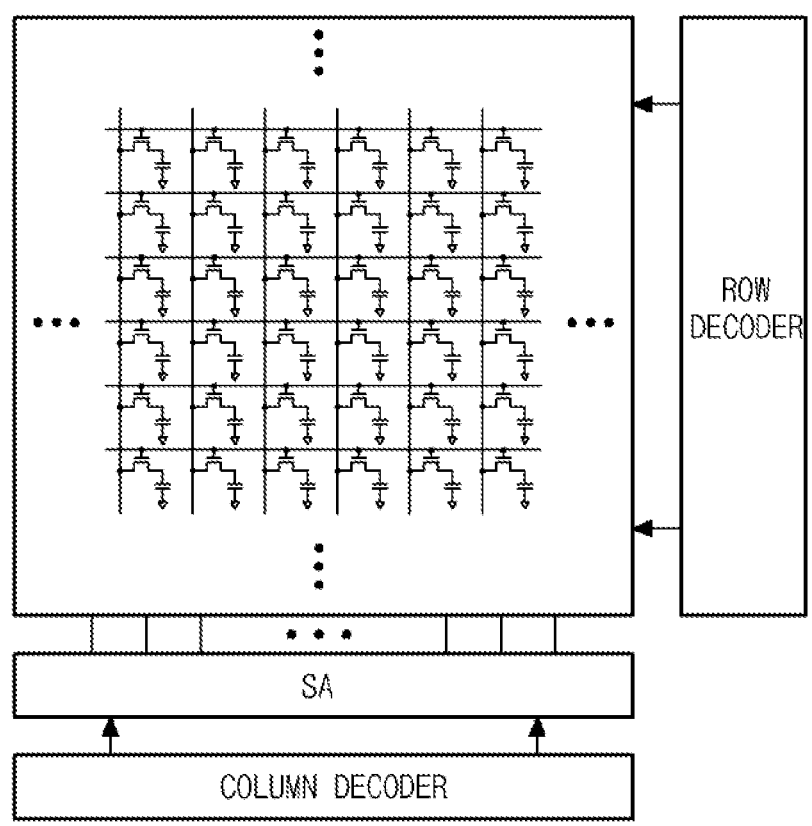
FIG. 4 is a view illustrating a semiconductor device according to an exemplary embodiment of the present invention.

FIG. 4 is a view illustrating a semiconductor device according to an exemplary embodiment of the present invention. Referring to FIG. 4, the semiconductor device may include a memory cell array, a row decoder, a column decoder, and a sense amplifier. In an embodiment, the memory cell array has the same structure as the memory cell array of FIG. 3. The row decoder selects a word line, which corresponds to a memory cell in which a read or write operation is to be performed of word lines of the memory cell array, and outputs a word line select signal to the memory cell array. The column decoder selects a bit line, which corresponds to a memory cell in which a read or write operation is to be performed of bit lines of the memory cell array, and outputs a bit line select signal to the memory cell array. Further, the sense amplifier senses data stored in a selected memory cell by the row decoder and the column decoder.

The semiconductor device according to an exemplary embodiment may be applied to dynamic random access memories (DRAMs), but it is not limited thereto. It may also be applied to, for example, static random access memories (SRAMs), flash memories, ferroelectric random access memories (FeRAMs), magnetic random access memories (MRAMs), phase change random access memories (PRAMs), etc.

The above-described semiconductor device may be provided for various electronic appliances, including, for example, desktop computers, portable computers, computing memories used in servers, graphics memories having various specs, and mobile memories that have been the focus of a lot of attention in recent years with advancements in mobile communication. Further, the above-described semiconductor device may be provided to various digital applications, including, for example, mobile recording mediums such as memory sticks, multimedia cards (MMCs), secure digitals (SDs), compact flashes (CFs), extreme digitals (xDs) picture cards, universal serial buses (USBs), flash devices, as well as other various applications such as MP3Ps, portable multimedia players (PMPs), digital cameras, camcorders, and mobile phone. A single type semiconductor device may be applied to a technology such as a multi-chip package (MCP), a disk on chip (DOC), or an embedded device. The single type semiconductor device may be applied to a CMOS image sensor, which may be included in various other devices such as camera phones, web cameras, and small-size image pick-up devices for medicine.

Figure 5:
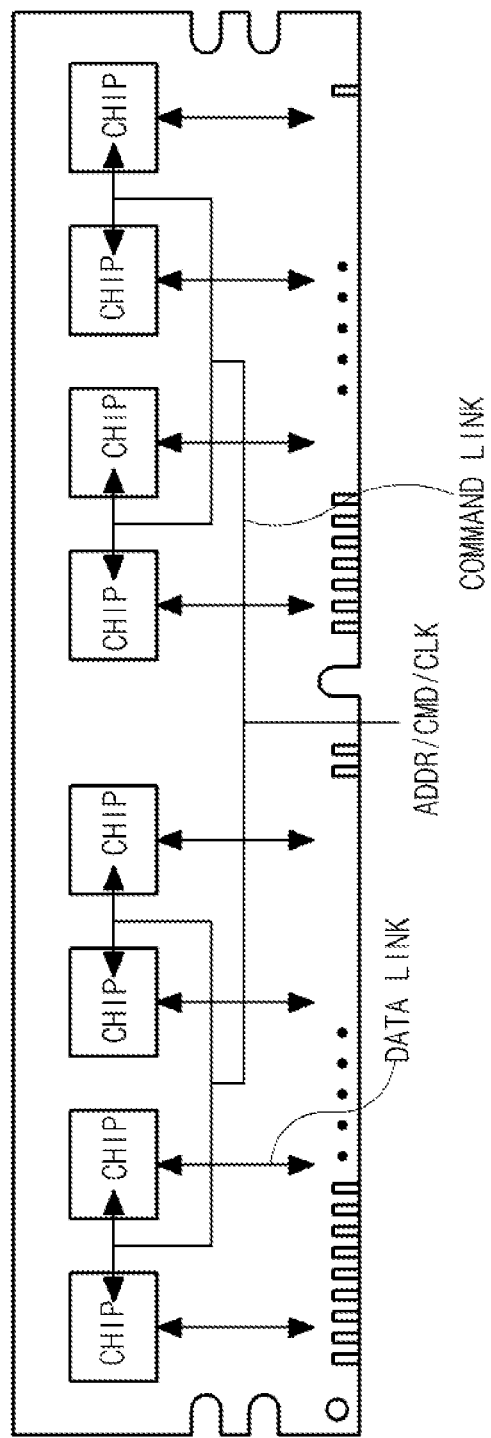
FIG. 5 is a view illustrating a semiconductor module according to an exemplary embodiment of the present invention.

FIG. 5 is a view illustrating a semiconductor module according to an exemplary embodiment of the present invention. Referring to FIG. 5, the semiconductor module of the exemplary embodiment includes semiconductor devices mounted on a module substrate, a command link that allows the semiconductor devices to receive control signals (address signal (ADDR), command signal (CMD), clock signal (CLK)) from an external controller (not shown), and a data link which is connected to the semiconductor devices and transfers data to and from the semiconductor devices. In an embodiment, the semiconductor device illustrated in FIG. 4 may be used as the semiconductor device. The same command link and data link as that used in the conventional semiconductor module may be used in an embodiment, or a command link and a data link that are similar to that used in the conventional semiconductor module may be used. Although FIG. 5 illustrates 8 semiconductor devices mounted on a front of the semiconductor module, semiconductor devices may also be mounted on a rear of the module substrate. That is, the semiconductor devices may be mounted on one side or both sides of the module substrate; the number of semiconductor devices is not limited to that shown in FIG. 5. In addition, material and construction of the module substrate are not specifically limited thereto.

Figure 6:
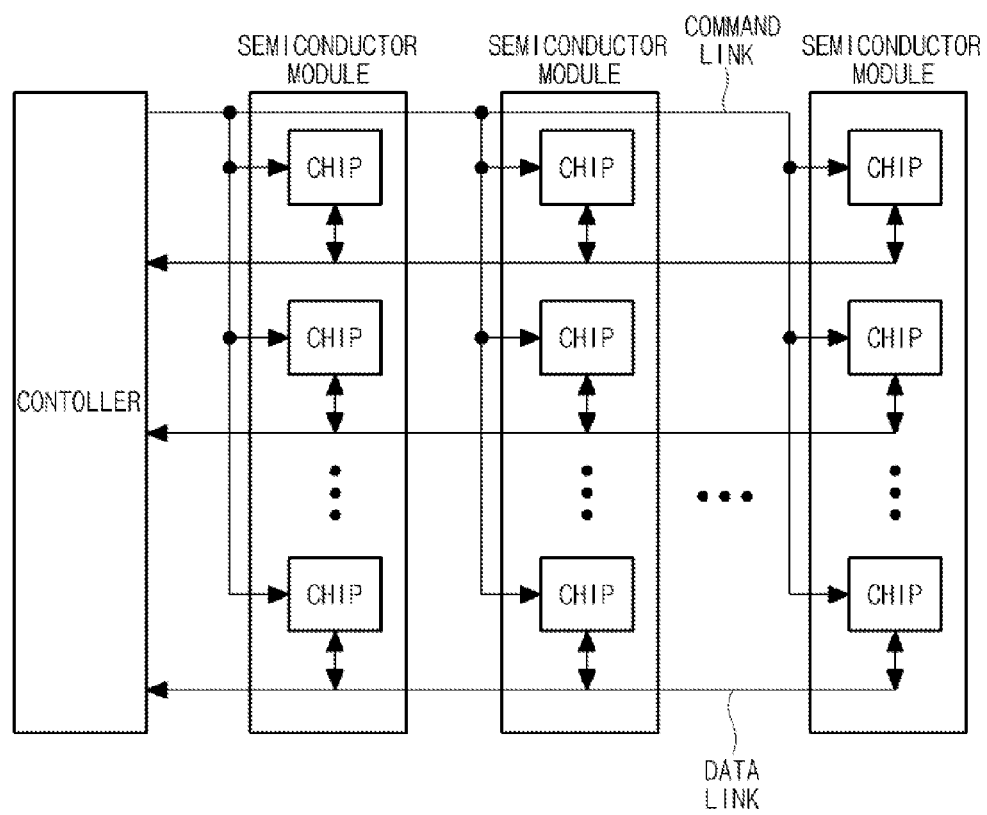
FIG. 6 is a view illustrating a semiconductor system according to an exemplary embodiment of the present invention.

FIG. 6 is a view illustrating a semiconductor system according to an exemplary embodiment of the present invention. Referring to FIG. 6, the semiconductor system of an exemplary embodiment includes at least one semiconductor module on which a plurality of semiconductor devices are mounted and a controller that provides a bidirectional interface between the semiconductor module and an external system (not shown) to control an operation of the semiconductor module. The semiconductor system may further include a command link and a data link, which connect the semiconductor module and the controller. The controller maybe configured to have the same functions or similar functions as a controller that controls an operation of a plurality of semiconductor modules in a conventional data processing system. Therefore, its detailed description in an exemplary embodiment will be omitted. In an embodiment, the semiconductor device of FIG. 4 may be used as the semiconductor device and the semiconductor module of FIG. 5 may be used as the semiconductor module.

Figure 7:
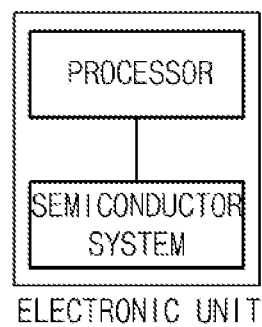
FIG. 7 is a view illustrating an electronic unit according to an exemplary embodiment of the present invention.

FIG. 7 is a view illustrating an electronic unit according to an exemplary embodiment. Referring to FIG. 7, the electronic unit according to an exemplary embodiment includes a semiconductor system and a processor electrically connected to the semiconductor system. The processor may include a central processing unit (CPU), a micro processor unit (MPU), a micro controller unit (MCU), a graphics processing unit (GPU) or a digital signal processor (DSP).

In an embodiment, the CPU or MPU has a combined configuration of an arithmetic logic unit (ALU), which is an arithmetic and logical operation unit, and a control unit, which reads and interprets commands to control each unit. When the processor is a CPU or MPU, the electronic unit may include computer appliances or mobile appliances. Further, a GPU is a CPU for graphics, and is used to calculate numbers having a decimal point. A GPU is a processor which draws graphics on a screen in real time. When the processor is a GPU, the electronic unit may include graphic appliances. A DSP is a processor which quickly converts an analog signal (for example, audio) into a digital signal, calculates the converted signal, and uses the calculated result or converts the calculated result into an analog again and uses the converted signal. The DSP typically calculates the digital value. When the processor is a DSP, the electronic unit may include audio and video appliances.

In addition, the processor includes an accelerate processor unit (APU). The processor has a combined construction of a CPU with a GPU and a processor serving as a graphic card.

Figure 8:
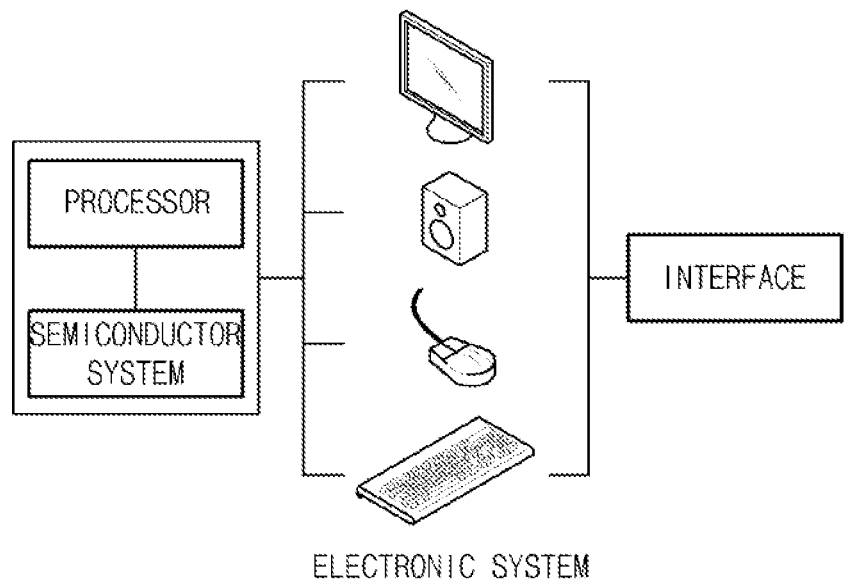
FIG. 8 is a view illustrating an electronic system according to an exemplary embodiment of the present invention.

As illustrated in FIG. 8, an electronic system includes an electric unit and one or a plurality of interfaces electrically connected to the electronic unit. In an embodiment, the electronic unit of FIG. 7 may be used as the electronic unit. The interface may include a monitor, a key board, a pointing device (mouse), USB, a display, or a speaker, but it is not limited thereto and it may be changeable.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

The present invention includes the following features.

1. A semiconductor cell, comprising:
a line type device isolation layer formed in a semiconductor substrate, the device isolation layer extending in a first direction;
a line type active region defined by the device isolation layer;
a first trench defining a fin type active region in the semiconductor substrate;
a second trench disposed adjacent to the first trench;
a first oxide layer formed over the first trench; and
a second oxide layer formed over the second trench and having a larger thickness than the first oxide layer.

2. The semiconductor cell of claim 1, the semiconductor cell further comprising:
a gate conductive layer formed over the first oxide layer and the second oxide layer; and
an insulating layer formed over the gate conductive layer.

3. The semiconductor cell of claim 2, the semiconductor cell further comprising:
an active gate defined by the gate conductive layer formed in the first trench; and
an isolation gate defined by the gate conductive layer formed in the second trench.

4. A cell array comprising:
a transistor including a semiconductor cell of claim 1; and
a storage unit coupled to the transistor.

5. A semiconductor device, comprising:
a cell array of claim 4;
a row decoder coupled to the cell array;
a column decoder coupled to the cell array; and
a sense amplifier coupled to the column decoder.

6. A semiconductor module, comprising:
a semiconductor device of claim 5;
a command link configured to transmit a control signal from and to the semiconductor device; and
a data link configured to transmit data from and to the semiconductor device.

7. A semiconductor system, comprising:
a semiconductor module of claim 6; and
a controller configured to control the semiconductor module.

8. An electronic unit, comprising:
a semiconductor system of claim 7; and
a processor configured to control the semiconductor system.

9. The electronic unit of claim 8, wherein the processor includes a central processing unit (CPU), a graphic processing unit (GPU) or a combination thereof.

10. The electronic unit of claim 9, wherein the CPU includes a computer, a mobile or a combination thereof.

11. The electronic unit of claim 9, wherein the GPU includes a graphic.

12. An electronic system, comprising:
an electronic unit of claim 8; and
an interface configured to transmit a communication signal from and to the electronic unit.

13. The electronic system of claim 12, wherein the interface includes any of a monitor, a key board, a pointing device (mouse), universal serial bus (USB), a display, and a speaker.

What is claimed is:

1. A method of forming a semiconductor cell, comprising:
forming device isolation line patterns in a semiconductor substrate;
forming a first trench defining an active region in the semiconductor substrate, wherein the active region protrudes from the device isolation line patterns;
forming a second trench in the semiconductor substrate to be in parallel to the first trench, the second trench defining an isolation region along with the device isolation line patterns;
performing an ion implantation process on the first trench; and
forming a first oxide layer over the first trench and a second oxide layer over the second trench,
wherein the second oxide layer is thicker than the first oxide layer.

2. The method of claim 1, wherein the forming the first trench and the second trench includes performing an anisotropic etching process on the semiconductor substrate and the device isolation line patterns.

3. The method of claim 2, wherein performing the anisotropic etching process includes etching the semiconductor substrate to a first depth and etching the device isolation line patterns to a second depth deeper than the first depth.

4. The method of claim 3, wherein the active region protrudes from the device isolation line patterns by a difference of the first depth and the second depth.

5. The method of claim 1, wherein the performing the ion implantation process includes:
forming a mask pattern over the second trench; and
performing the ion implantation process on the first trench using the mask pattern as a mask.

6. The method of claim 1, wherein the performing the ion implantation process includes ion-implanting nitrogen ions.

7. The method of claim 1, wherein the ion implantation process is performed with a dose of $1 \times 10^{12}/cm^2$ to $1 \times 10^{15}/cm^2$ and energy of 5 KeV to 100 KeV.

8. The method of claim 1, wherein the on implantation process is performed on the first trench at an angle of 1 to 45 degrees with respect to a direction perpendicular to the semiconductor substrate.

9. The method of claim 5, the method further comprising removing the mask pattern.

10. The method of claim 1, the method further comprising:
forming a gate conductive layer over the first oxide layer and the second oxide layer; and
forming an insulating layer over the gate conductive layer.

11. A method of forming a semiconductor array, comprising:
forming a pair of device isolation line patterns in a semiconductor substrate;
forming a pair of first trenches extending across the pair of the device isolation line patterns to a first depth;
forming a second trench between the pair of the first trenches to be extend across the pair of the device isolation line patterns, wherein the first trench and second trench are, formed to a second depth deeper than the first depth in the device isolation line patterns so that the active region is in an uplifted fin shape;

performing ion implantation selectively on the second trench so that an amount of the ions implanted in the second trench is different from that implanted in the first trench;

forming an isolation gate oxide pattern over any of the pair of the first trenches; and forming an active gate oxide pattern over the second trench, wherein the isolation gate oxide pattern is formed thicker than the active gate oxide pattern.

12. The method of claim 11, wherein the isolation gate oxide pattern and the active gate oxide pattern are formed by oxidizing the substrate exposed in the first trenches and the second trench.

13. The method of claim 11, the method further comprising:

forming an isolation gate pattern over the isolation gate oxide pattern; and forming an active gate pattern over the active gate oxide pattern.

\* \* \* \* \*